United States Patent [19]
Tanaka et al.

[11] 3,963,523
[45] June 15, 1976

[54] METHOD OF MANUFACTURING SEMICONDUCTOR DEVICES

[75] Inventors: Yoshimi Tanaka, Kyoto; Hirotsugu Hattori, Takatsuki, both of Japan

[73] Assignee: Matsushita Electronics Corporation, Osaka, Japan

[22] Filed: Dec. 24, 1974

[21] Appl. No.: 536,240

Related U.S. Application Data
[63] Continuation-in-part of Ser. No. 354,520, April 26, 1973, abandoned.

[52] U.S. Cl............................. 148/1.5; 148/188; 427/88
[51] Int. Cl.².................................. H01L 21/225
[58] Field of Search............ 148/1.5, 188; 117/212, 117/217

[56] References Cited
UNITED STATES PATENTS

| | | | |
|---|---|---|---|
| 3,337,779 | 8/1967 | Bowman et al. | 148/1.5 X |
| 3,356,543 | 12/1967 | Desmond et al. | 148/188 X |
| 3,360,695 | 12/1967 | Lindmayer | 148/188 X |
| 3,640,783 | 2/1972 | Bailey | 148/188 X |
| 3,711,325 | 1/1973 | Hentzschel | 117/212 |

Primary Examiner—L. Dewayne Rutledge
Assistant Examiner—J. M. Davis
Attorney, Agent, or Firm—Stevens, Davis, Miller & Mosher

[57] ABSTRACT

A method of manufacturing semiconductor devices is provided which comprises the steps of depositing a coating of platinum on the surface of a silicon substrate prior to the formation of a plated nickel layer thereon, plating a layer of nickel on the silicon substrate coated with platinum, and then subjecting the structure to the process of heat treatment to thereby cause the platinum to diffuse into the silicon substrate, whereby the platinum acts to increase the adhesion strength of the plated nickel layer on the silicon substrate and further the platinum element diffused into the silicon substrate serves as a lifetime killer of carriers to thereby improve the switching characteristic of the semiconductor device.

4 Claims, 9 Drawing Figures

METHOD OF MANUFACTURING SEMICONDUCTOR DEVICES

CROSS-REFERENCE TO A RELATED APPLICATION

This is a continuation-in-part application of prior application Ser. No. 354,520 filed Apr. 26, 1973, now abandoned.

BACKGROUND OF THE INVENTION

1. Field of the Invention

The present invention relates to a method of manufacturing semiconductor devices and more particularly to a method of preliminary processing for the nickel plating which improves the formation of a plated layer of nickel in a semiconductor device and which improves the characteristics of the semiconductor device.

2. Description of the Prior Art

In the production of ohmic contact electrodes for semiconductor devices, e.g., silicon semiconductor devices, the production of electrodes by the process of nickel plating has heretofore been used frequently and particularly the production of electrodes by the process of electroless nickel plating has been resorted to in many cases.

As is well known in the art, the electroless nickel plating is a chemical plating and therefore various considerations have been given to the preliminary processing for the electroless nickel plating and also to the surface treatment in order to increase the adhesion strength of a nickel layer to a semiconductor substrate (silicon substrate) or the adhesion strength of a nickel layer with external lead wires.

In fact, however, even with such considerations the results obtained have not been completely satisfactory.

SUMMARY OF THE INVENTION

The present invention is intended to overcome the foregoing deficiency involved in the prior art methods of producing ohmic contact electrodes by the electroless nickel plating process, and it is an object of the present invention to provide a method of preliminary processing which increases the adhesion strength of a plated layer of nickel on the surface of a silicon substrate for a semiconductor device and which improves the switching characteristic of the resultant semiconductor device.

It is another object of the present invention to provide a method of manufacturing semiconductor devices in which prior to the plating with nickel of a silicon substrate having a PN junction formed therein, the silicon substrate is dipped for a predetermined time in a aqueous solution containing for example chloroplatinic acid and hydrofluoric acid to deposit a coating of platinum on the surface of the silicon substrate and thereafter the silicon substrate is subjected to a baking process in an inert atmosphere.

The use of these processing steps in the present invention is a very great advantage, since the thin coating of platinum thus deposited on the silicon substrate acts to increase the adhesion strength to the silicon substrate of a plated nickel layer formed by the next step and moreover the high temperature heat treatment performed for baking the plated nickel layer causes the platinum element to diffuse into the silicon substrate and act as a lifetime killer of the carriers to thereby improve the switching characteristic of the semiconductor device.

In accordance with the present invention, there is provided a method of manufacturing a semiconductor device comprising the steps of depositing a coating of platinum at least on one surface of a silicon substrate having at least one PN junction formed therein, thereafter plating a layer of nickel on the platinum coated silicon substrate, and subjecting the plated nickel layer to a heat treatment at a temperature sufficient to cause the platinum to diffuse into the silicon substrate.

Other objects, features and advantages of the invention will become apparent from the following detailed description when taken in conjunction with the accompanying drawings.

DESCRIPTION OF THE PREFERRED EMBODIMENT

A preferred embodiment of the method according to the present invention will now be explained for illustrative purposes with reference to FIGS. 1 through 6.

Figure 1:
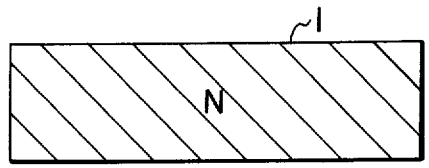
FIGS. 1 through 6 are diagrams showing a series of steps for manufacturing a silicon diode according to a method of this invention.

Referring to the drawings showing a series of steps for manufacturing a silicon diode, an N-type silicon substrate 1 is prepared first as shown in FIG. 1.

Figure 2:
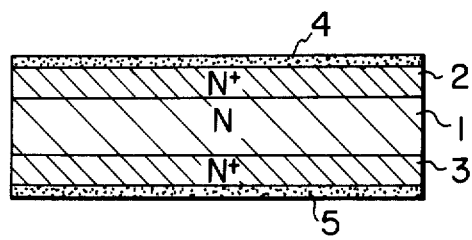
Figure 3:
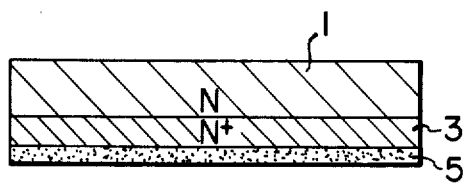

Thereafter, N-type impurity, e.g., phosphorus is diffused into the silicon substrate 1. This diffusion treatment results in the formation of $N^+$ diffused regions 2 and 3 in the silicon substrate 1. During this diffusion treatment, silicon dioxide coatings 4 and 5 are also formed on the surfaces of the silicon substrate 1 (FIG. 2).

One of the $N^+$ diffused regions formed in the silicon substrate is then removed for example by a lapping treatment so that one of the two surfaces of the N region 1 is exposed (FIG. 3) and a P-type impurity, e.g., boron is diffused from this exposed surface into the substrate.

Figure 4:
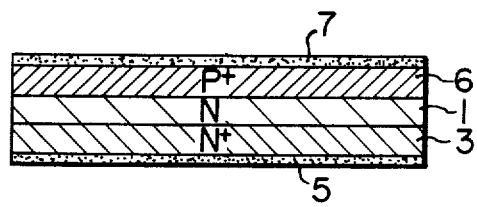

FIG. 4 shows the structure obtained after the diffusion of the P-type impurity, with numeral 6 indicating a $P^+$ diffused region and numeral 7 indicating a silicon dioxide coating produced during the formation of the $P^+$ diffused region 6.

As the result of these steps, a $P^+NN^+$ silicon diode is produced in the silicon substrate. In other words, in this $P^+NN^+$ structure the $P^+$ diffused region 6 and $N^+$ diffused region 3 serve respectively as a foundation layer on which an electrode is to be formed.

The silicon dioxide coatings on the silicon substrate having the $P^+NN^+$ diode built therein in the above-described manner are removed entirely and the silicon substrate is then dipped for a short period of time (3 to 5 minutes) into an aqueous solution containing chloroplatinic acid and hydrofluoric acid.

When the silicon substrate is dipped in this aqueous solution, the platinum element separated from the chloroplatinic acid by the reducing reaction of the hydrofluoric acid is deposited on the surfaces of the silicon substrate from which the silicon dioxide has been removed by the same hydrofluoric acid, thereby forming a platinum coating having a thickness of 0.1 to 0.4 $\mu$ on the surfaces of the silicon substrate.

Figure 5:
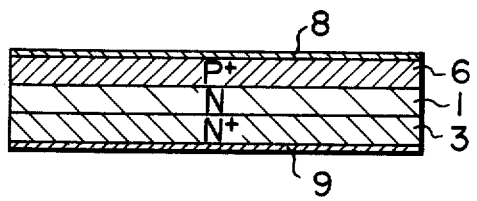

After the formation of the platinum coatings, the silicon substrate is subjected to rinsing and drying processes and then the silicon substrate is subjected to a heat treatment for about 5 to 10 minutes in an inert atmosphere at a temperature in the order of 700°C. FIG. 5 shows the silicon substrate after the heat treatment and numerals 8 and 9 indicate the platinum coatings.

Figure 6:
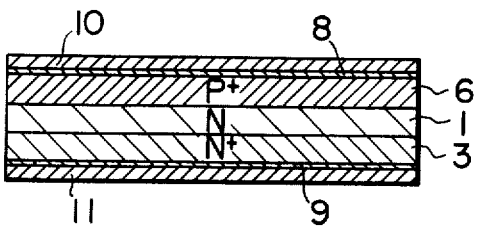

Thereafter, nickel layers 10 and 11 are formed on the surfaces of the silicon substrate by a known type of electroless nickel plating process (FIG. 6).

The thus plated nickel layers are not entirely satisfactory from the aspect of their adhesive property in relation to the silicon substrate and therefore their contact resistance cannot be said to be sufficiently low.

For this reason, the plated nickel layers are subjected to a treatment which bakes the plated nickel layers on the silicon substrate and this heat treatment is effected by heating the nickel layers in an inert atmosphere at a temperature of 800° to 900°C.

By this heating treatment, the platinum coatings on the silicon substrate are caused to act to improve the adhesion between the plated nickel layers and the silicon substrate and simultaneously the diffusion of platinum element into the silicon substrate takes place. In other words, the platinum element diffused in the silicon substrate acts as a lifetime killer of the carriers.

In order that the platinum on the silicon substrate may act as above described, it is desirable that the heating time ranges from 10 to 60 minutes.

By going through these steps, the production of a semiconductor device portion according to the present invention is completed.

As mentioned above, the platinum coating has a thickness of 0.1 to 0.4 $\mu$ and the heat treatment for baking the plated nickel is effected at a temperature of 800° to 900°C. These ranges are very important to produce a semiconductor device according to the present invention.

Figure 7:
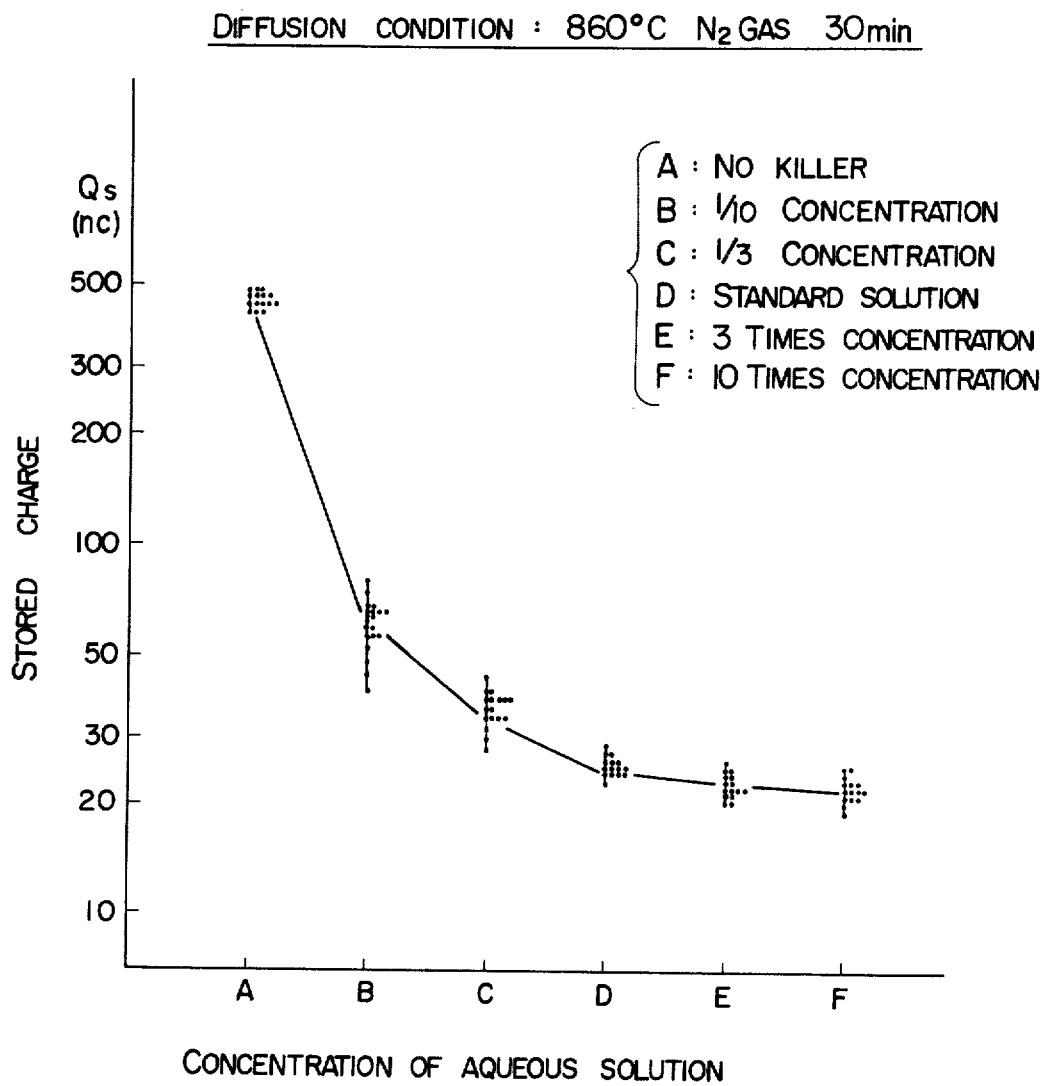
FIG. 7 is a graph showing relationship between Qs and platinum coatings having various thicknesses.

Referring now to FIG. 7, the changes of the stored charge (Qs) with the thicknesses of the platinum coating are shown. In the figure, an example A shows results when the platinum is not coated. An example B shows results when the thicknesses of the platinum coating are so thin that they cannot be seen with the naked eye. The following Table 1 shows relationships between the thickness of the platinum coating and concentrations of the aqueous solution containing chloroplatinic acid and hydrofluoric acid with respect to the examples C, D and E:

Table 1

| | Concentration of the aqueous solution | Thickness of the platinum coating |
|---|---|---|
| C | ½ Dilution | 0.13 – 0.22 $\mu$ |
| D | Standard Concentration | 0.20 – 0.30 $\mu$ |
| E | 3 Times Concentration | 0.29 – 0.40 $\mu$ |

As understood from FIG. 7, there is no killer effect in the example A. In the example B, it is recognized that a small quantity of platinum is diffused into the silicon substrate because Qs is slightly smaller than in the example A. The thickness of platinum coating is increased as the concentration of aqueous solution increases. In the examples C, D, E and F, there are raised sufficient killer effect and it is substantially saturated in the examples E and F. Therefore, it is uneconomical to use a further concentrated aqueous solution from the standpoint of manufacturing cost. As a result, the thickness of the platinum coating is preferably about 0.1 to 0.4 $\mu$.

Figure 8:
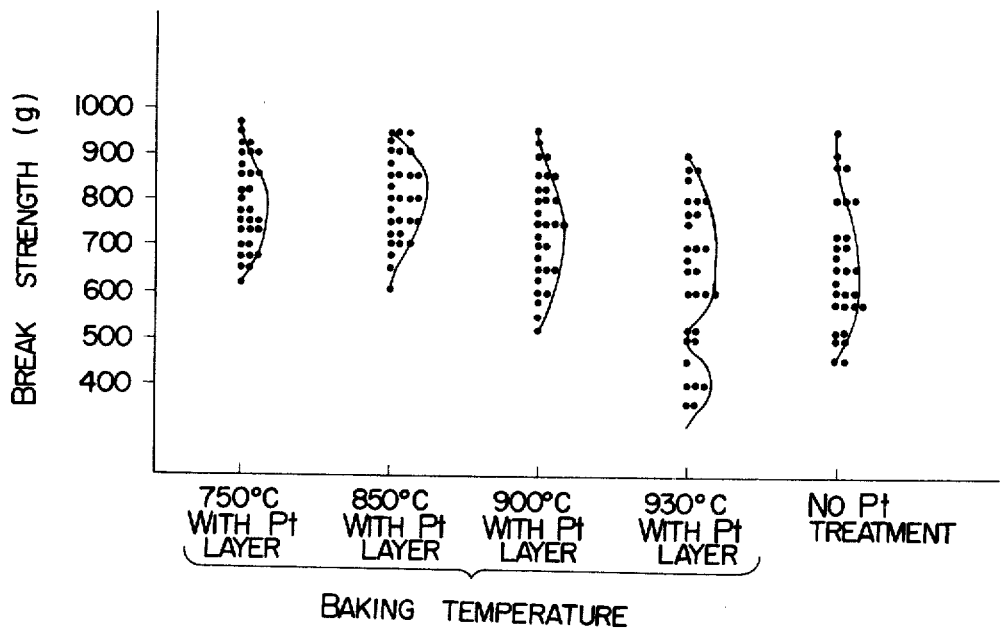
FIG. 8 is a graph showing relationship between baking temperatures and break strength.
Figure 9:
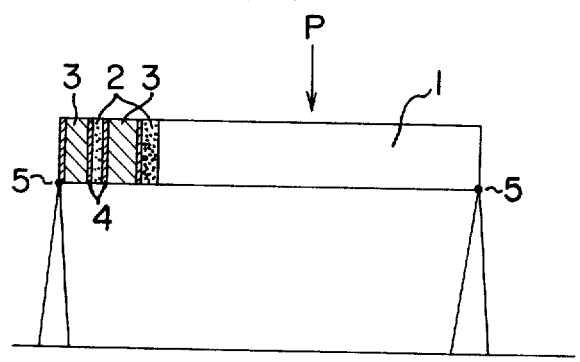
FIG. 9 is a diagram showing a method of measuring the break strength.

Now refer to FIG. 8 showing the relationship between baking temperatures of the plated nickel layer and the break strength of the baked nickel layer. It is possible to determine bonding strength of the plated nickel layer by measuring the break strength in a manner described hereunder with reference to FIG. 9. In FIG. 9, numeral 1 designates a laminated body 1, 2 solder layer, 3 silicon substrates, 4 nickel layers, and 5 supporting points. The arrow P represents the direction of pressure.

In order to determine the plating strength between Si-Ni, 20 pieces of rectifier elements having silicon substrate size of 0.9 × 0.9 mm square were laminated through solder to bond together, to which a pressure was applied from the sides thereof, as shown in FIG. 9 to determine the force required to break the laminated assembly; that is, the break strength of the laminated assembly. Since it is considered that the strength of the solder layer is stronger than that of the Ni layer, it is possible to determine the bonding strength of the Ni plated layer to the silicon substrate by measuring the breaking strength.

FIG. 8 shows the results of the measurements.

It is seen from FIG. 8 that the lot having the Pt layer and subjected to 850°C heat treatment has a larger absolute value of break strength than those for other lots and smaller extent of distribution of the break strength in a lot. At the baking temperature of 900°C, although the average break strength is slightly smaller than that for baking at a temperature of 850°C, this value is satisfactory for practical use. When the baking is effected above 900°C, the resolution of Pt into the Si layer progresses and the resolved Pt layer does not remain on the silicon surface, resulting in poor bonding force. Therefore the upper limit of the baking temperature is practically 900°C. Furthermore, it has been confirmed by another experiment that the killer effect given by the baking treatment above 900°C is too strong, that is, the diffusion of platinum into silicon is too much, resulting in production of the diode having a switching speed which is too fast, a decreased withstand voltage and an increased voltage drop in the forward direction.

Good results are obtained with respect to the bonding force when the baking is effected at 750°C. The characteristics of the bonding force are substantially equal between the baking temperature range of 750° to 850°C. However, the killer effect cannot be expected if the baking is effected below 800°C, since the diffusion of platinum into the silicon substrate is too little to give the killer effect to the semiconductor device of the present invention. This fact has been confirmed by another experiment. Thus, the lower limit of the baking temperature is 800°C.

According to the above consideration, the thickness of the platinum coating is preferably 0.1 to 0.4 $\mu$ and the baking temperature is 800° to 900°C.

It will thus be seen from the foregoing description that according to the method of this invention, the platinum coatings placed between the plated nickel layers and the silicon substrate not only act to increase the adhesion strength therebetween, but also serve as a diffusion source so that the platinum element diffuses into the silicon substrate during the heat treatment of the plated nickel layers and act as a lifetime killer of the carriers.

Accordingly, in a semiconductor device manufactured according to the present invention, excellent contact is ensured between the electrodes and the substrate and moreover the switching characteristic of the semiconductor device is improved.

While the present invention has been described as applied to the manufacture of a silicon diode, the present invention may of course be applied to the manufacture of other semiconductor devices as well.

We claim:

1. A method of manufacturing a semiconductor device comprising the steps of depositing a coating of platinum having a thickness of 0.1 to 0.4 $\mu$ on at least one surface of a silicon substrate having at least one PN junction formed therein, subjecting said substrate to a first heat treatment for increasing the adhesion strength of the plated platinum layer to the silicon substrate, plating a layer of nickel on said silicon substrate coated with platinum, and then subjecting said plated nickel layer to a second heat treatment at a temperature of 800° to 900°C to cause said platinum to diffuse into said silicon substrate.

2. A manufacturing method according to claim 1, wherein said step for depositing a platinum coating consists of dipping said silicon substrate into an aqueous solution containing chloroplatinic acid and hydrofluoric acid.

3. A manufacturing method according to claim 1, wherein said first heat treatment step for said plated platinum layer is performed for 5 to 10 minutes in an inert atmosphere at a temperature of about 700°C.

4. A manufacturing method according to claim 1, wherein said second heat treatment step for said plated nickel is performed for 10 to 60 minutes in an inert atmosphere.

* * * * *